United States Patent
Smith et al.

(10) Patent No.: US 10,068,376 B2
(45) Date of Patent: Sep. 4, 2018

(54) UPDATING MIXED REALITY THUMBNAILS

(71) Applicant: MICROSOFT TECHNOLOGY LICENSING, LLC, Redmond, WA (US)

(72) Inventors: Jeff Smith, Duvall, WA (US); Cameron Graeme Brown, Bellevue, WA (US); Marcus Ghaly, Kirkland, WA (US); Andrei A. Borodin, Bellevue, WA (US); Jonathan Gill, Seattle, WA (US); Cheyne Rory Quin Mathey-Owens, Seattle, WA (US); Andrew Jackson, Kirkland, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 14/992,934

(22) Filed: Jan. 11, 2016

(65) Prior Publication Data

US 2017/0200312 A1    Jul. 13, 2017

(51) Int. Cl.
*G06T 19/00*     (2011.01)
*G06T 15/50*     (2011.01)
(Continued)

(52) U.S. Cl.
CPC .......... *G06T 19/006* (2013.01); *G02B 27/017* (2013.01); *G06F 17/30126* (2013.01);
(Continued)

(58) Field of Classification Search
CPC ................................ G06T 3/60; G06T 19/006
See application file for complete search history.

(56) References Cited

U.S. PATENT DOCUMENTS

| 6,466,237 B1* | 10/2002 | Miyao | G06F 3/0483 |
|---|---|---|---|
| | | | 707/E17.029 |
| 2004/0100482 A1* | 5/2004 | Cajolet | G06T 13/00 |
| | | | 715/716 |

(Continued)

FOREIGN PATENT DOCUMENTS

| CN | 101354793 A | 1/2009 |
|---|---|---|
| EP | 2892028 A2 | 7/2015 |

OTHER PUBLICATIONS

Tian, Y. et al., "Handling Occlusions in Augmented Reality Based on 3D Reconstruction Method", Neurocomputing, vol. 156, May 25, 2015, Available online Jan. 9, 2015, Wuhan, China, 9 pages.

(Continued)

*Primary Examiner* — Jitesh Patel
(74) *Attorney, Agent, or Firm* — Alleman Hall Creasman & Tuttle LLP

(57) ABSTRACT

Examples are disclosed herein that relate to the display of mixed reality imagery. One example provides a mixed reality computing device comprising an image sensor, a display device, a storage device comprising instructions, and a processor. The instructions are executable to receive an image of a physical environment, store the image, render a three-dimensional virtual model, form a mixed reality thumbnail image by compositing a view of the three-dimensional virtual model and the image, and display the mixed reality thumbnail image. The instructions are further executable to receive a user input updating the three-dimensional virtual model, render the updated three-dimensional virtual model, update the mixed reality thumbnail image by compositing a view of the updated three-dimensional virtual model and the image of the physical environment, and display the mixed reality thumbnail image including the (Continued)

updated three-dimensional virtual model composited with the image of the physical environment.

20 Claims, 6 Drawing Sheets

(51) Int. Cl.
| | | |
|---|---|---|
| *G06T 13/20* | (2011.01) | |
| *G02B 27/01* | (2006.01) | |
| *G06F 17/30* | (2006.01) | |
| *G06F 17/50* | (2006.01) | |
| *G06T 19/20* | (2011.01) | |

(52) U.S. Cl.
CPC ............ *G06F 17/50* (2013.01); *G06T 13/205* (2013.01); *G06T 15/506* (2013.01); *G06T 19/20* (2013.01); *G02B 2027/0178* (2013.01); *G06F 2206/1008* (2013.01); *G06T 2215/16* (2013.01); *G06T 2219/2012* (2013.01); *H04N 2201/325* (2013.01)

(56) References Cited

U.S. PATENT DOCUMENTS

| | | | | |
|---|---|---|---|---|
| 2004/0160640 | A1* | 8/2004 | Corrales | G03B 35/00 |
| | | | | 358/1.18 |
| 2006/0064716 | A1* | 3/2006 | Sull | G06F 17/30793 |
| | | | | 725/37 |
| 2006/0119618 | A1 | 6/2006 | Knighton et al. | |
| 2007/0171237 | A1* | 7/2007 | Pinter | G06T 11/60 |
| | | | | 345/629 |
| 2008/0123913 | A1 | 5/2008 | Virag et al. | |
| 2008/0307307 | A1* | 12/2008 | Ciudad | G06T 13/80 |
| | | | | 715/719 |
| 2009/0195650 | A1* | 8/2009 | Hanai | G06T 11/60 |
| | | | | 348/143 |
| 2011/0210962 | A1* | 9/2011 | Horan | G06T 15/20 |
| | | | | 345/419 |
| 2012/0182286 | A1 | 7/2012 | Wang | |
| 2013/0141434 | A1 | 6/2013 | Sugden et al. | |
| 2014/0002490 | A1* | 1/2014 | Teegan | G06T 19/006 |
| | | | | 345/633 |
| 2014/0118353 | A1 | 5/2014 | Ha et al. | |
| 2014/0132725 | A1 | 5/2014 | Hsieh et al. | |
| 2014/0195963 | A1* | 7/2014 | Cheung | G06F 17/50 |
| | | | | 715/781 |
| 2014/0226000 | A1* | 8/2014 | Vilcovsky | G06F 3/017 |
| | | | | 348/77 |
| 2014/0267406 | A1* | 9/2014 | Mullins | G06T 19/006 |
| | | | | 345/633 |
| 2014/0281998 | A1* | 9/2014 | Hwangbo | G06F 3/0482 |
| | | | | 715/720 |
| 2014/0300775 | A1* | 10/2014 | Fan | H04N 5/23229 |
| | | | | 348/231.3 |
| 2014/0333667 | A1* | 11/2014 | Jung | G06T 11/00 |
| | | | | 345/633 |
| 2015/0022551 | A1* | 1/2015 | Kim | G06T 19/006 |
| | | | | 345/633 |
| 2015/0103097 | A1* | 4/2015 | Li | G06F 17/30268 |
| | | | | 345/633 |

OTHER PUBLICATIONS

Okura, et al., "Mixed-Reality World Exploration Using Image-Based Rendering", In Journal on Computing and Cultural Heritage, vol. 8, Issue 2, Mar., 2015, 26 pages.

Limper, et al., "Evaluating 3D thumbnails for virtual object galleries", In Proceedings of the 20th International Conference on 3D Web Technology, Jun. 18, 2015, pp. 17-24.

Evers-Senne, et al., "Image-based Rendering of Complex Scenes from a Multi-Camera Rig", In Proceedings of IEEE Vision, Image and Signal Processing, vol. 152, Issue 4, Aug. 5, 2005, pp. 1-29.

Ladikos, et al., "Real-Time 3D Reconstruction for Occlusion-aware Interactions in Mixed Reality", In Proceedings of he 5th International Symposium on Advances in Visual Computing, Nov. 26, 2009, pp. 1-10.

Chen, H. et al., "3D Collaboration Method over HoloLens™ and Skype™ End Points", In the Proceedings of the 3rd International Workshop on Immersive Media Experiences, Oct. 30, 2015, Brisbane, Australia, 4 pages.

Gauglitz, S. et al., "World-Stabilized Annotations and Virtual Scene Navigation for Remote Collaboration", In Proceedings of the 27th Annual ACM Symposium on User Interface Software and Technology, Honolulu, Hawaii, USA, Oct. 5, 2014, 11 Pages.

ISA European Patent Office, International Search Report and Written Opinion Issued in PCT Application No. PCT/US2016/068632, dated Apr. 18, 2017, WIPO, 13 Pages.

Stein, S., Developers, Meet your HoloLens: A Tour of Microsoft's new Developer Showcase, CNET Website, Available Online at https://www.cnet.com/news/developers-meet-your-hololens-a-tour-of-microsofts-just-opened-developer-showcase-in-new-york-city/, Dec. 17, 2015, 6 Pages.

\* cited by examiner

UPDATING MIXED REALITY THUMBNAILS

BACKGROUND

Mixed reality computing devices enable the composition of real imagery with virtual, rendered imagery to form mixed reality imagery. Some mixed reality computing devices use optical image combining techniques, such that a user views virtual imagery displayed via a see-through display over a view of a real-world background.

SUMMARY

Examples are disclosed herein that relate to the display of mixed reality imagery. One example provides a mixed reality computing device comprising an image sensor, a display device, a storage device comprising instructions, and a processor. The instructions are executable to receive an image of a physical environment, store the image, render a three-dimensional virtual model, form a mixed reality thumbnail image by compositing a view of the three-dimensional virtual model and the image, and display the mixed reality thumbnail image. The instructions are further executable to receive a user input updating the three-dimensional virtual model, render the updated three-dimensional virtual model, update the mixed reality thumbnail image by compositing a view of the updated three-dimensional virtual model and the image of the physical environment, and display the mixed reality thumbnail image including the updated three-dimensional virtual model composited with the image of the physical environment.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
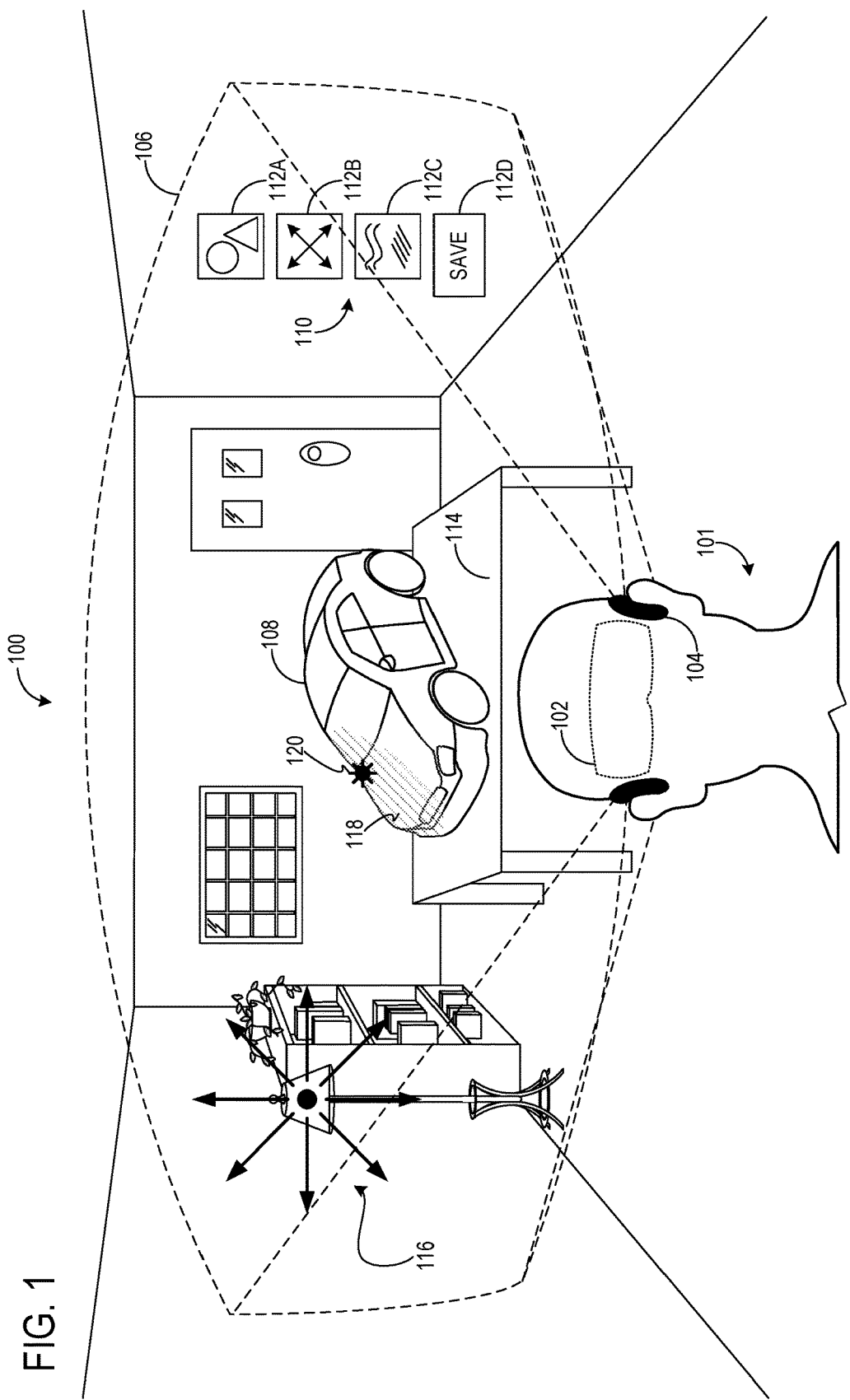
FIG. 1 shows an example mixed reality environment, and illustrates an example three-dimensional virtual model.

FIG. 1 shows an example use environment 100 in which a user 101 interacts with an example mixed reality (MR) computing device 104. MR computing device 104 is shown in FIG. 1 in the form of a head-mounted display (HMD) device, but other examples may take any other suitable form. Example hardware configurations are described below with reference to FIGS. 6 and 7, respectively.

MR computing device 104 is operable to present MR imagery to user 101 via a see-through display device, schematically depicted at 102. MR imagery comprises real imagery, for example as viewed through a see-through display, and virtual imagery displayed via the see-through display device 102. FIG. 1 depicts a field-of-view (FOV) 106 of see-through display device 102 representing the spatial region in which virtual imagery may be perceived by user 101. The angular extent of FOV 106 may be equal to, greater than, or less than the portion of environment 100 viewable through see-through display device 102.

MR computing device 104 may be configured to allow user 101 to create and edit virtual imagery for display on see-through display device 102. FIG. 1 depicts an example three-dimensional virtual model 108 that is rendered and displayed via see-through display device 102, and also depicts an example user interface 110 for creating and editing the three-dimensional virtual model 108. The user interface 110 includes various elements each operable to effect a functionality relating to the creation of virtual imagery. For example, user interface 110 may include a control 112A for selecting a variety of primitives and shapes with which to build three-dimensional virtual models, a control 112B for resizing and morphing primitives and shapes, and a control 112C for applying color and textures to primitives and shapes.

User 101 may interact with the user interface 110 via any suitable user input mechanism. Examples include user inputs made via sensors on the see-through display device 102, such as hand gestures, head gestures, other body part gestures, voice inputs, and gaze inputs. Example input sensors are described in more detail below. Inputs also may be made by a peripheral device (e.g., keyboard, mouse, touch sensor, game controller) operatively coupled to MR computing device 104.

Once the user 101 has reached a desired stopping point in the process of generating the three-dimensional virtual model 108, the model may be saved for later viewing and/or modification via a "save" user interface element 112D. As explained in more detail below, selection of the save user interface element 112D may cause the three-dimensional virtual model 108 to be saved in a save file with other data, such as environmental data relating to physical environment 100 (e.g., lighting, depth, and/or acoustic data), and a thumbnail image representing the three-dimensional virtual model in the physical environment. The three-dimensional virtual model 108, and its corresponding save file, may be saved locally, or on a remote storage device accessible via a network.

Figure 2:
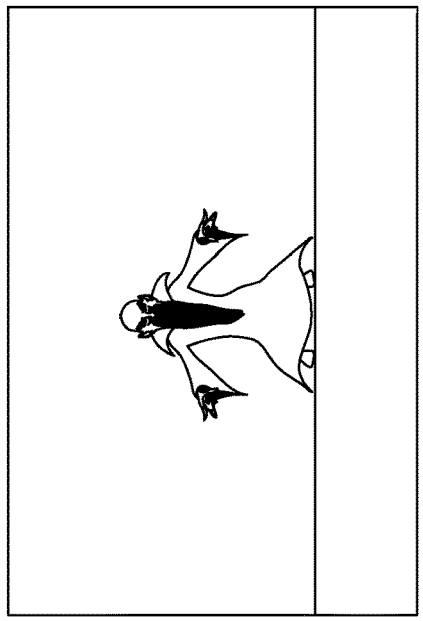
FIG. 2 shows an example user interface including mixed reality thumbnail images.
Figure 2:
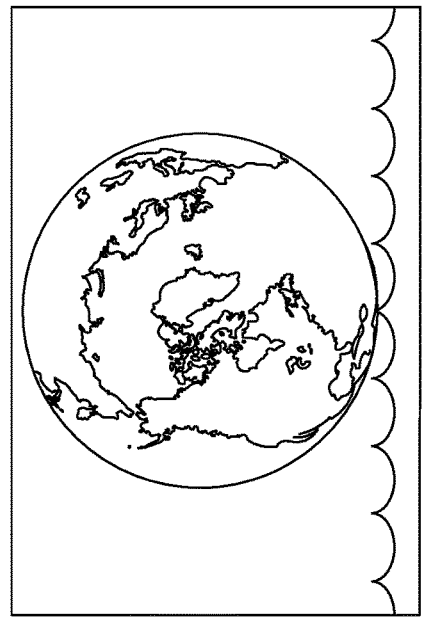
Figure 2:
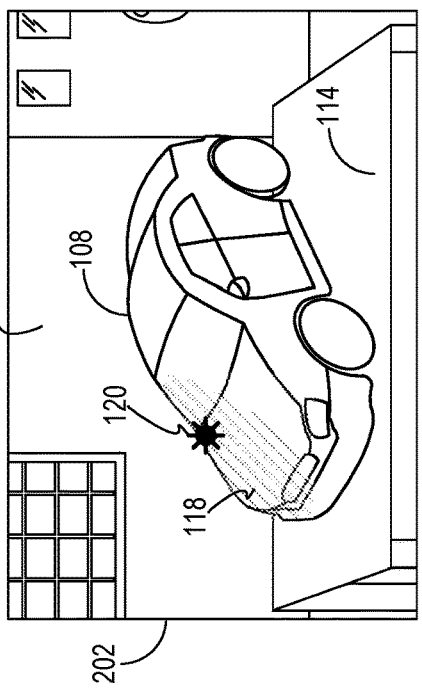
Figure 2:
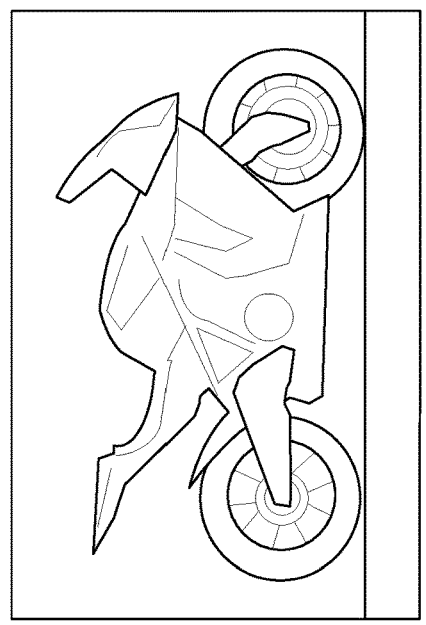

A representation of the saved three-dimensional model may be used to generate the thumbnail image that represents the data file for the three-dimensional model. FIG. 2 shows a graphical user interface 200 displayable on a computing device display that depicts an example visual representation of three-dimensional virtual model 108 as a thumbnail image 202. Thumbnail image 202 may be displayed along with other thumbnail images that each depicts a corresponding saved three-dimensional virtual model. Each thumbnail image in user interface 200 may serve as a user interface control to effect various actions, such as opening a selected three-dimensional virtual model for editing.

Thumbnail image 202 includes an image 204 of environment 100 composited with a view of three-dimensional virtual model 108. Image 204 may be captured via an outward facing image sensor of MR computing device 104 upon saving of three-dimensional virtual model 108, for example. Due to the inclusion of real and virtual imagery therein, thumbnail image 202 may be referred to as a mixed reality (MR) thumbnail image. Images of physical environments, when composited with the three-dimensional virtual models created in those environments, may visually remind users of the physical location where the three-dimensional virtual models were created. Such an approach may provide continuity to a three-dimensional virtual model generation process that is performed across multiple use sessions. Thus, as described in more detail below, when a virtual model is edited and re-saved, the updated virtual model may be rendered and again composited with the image 204 of the environment in which the model was originally created, so that the user may view a most recent version of the virtual model together with the original physical environment in which it was created.

The rendering of a three-dimensional virtual model for the production of an MR thumbnail image may consider aspects of the physical environment in which the three-dimensional virtual model is generated. For example, a three-dimensional virtual model may be rendered in consideration of the depth of one or more surfaces of a physical environment. Returning to FIG. 1, three-dimensional virtual model 108 is shown rendered as if it were resting on a table 114 in environment 100. In other examples, a three-dimensional virtual model may be rendered without considering the surfaces in environment—e.g., such that the model is rendered in a free-floating manner within FOV 106. To facilitate the detection of surfaces in environment 100, MR computing device 104 may include a suitable depth sensor, as described below with reference to FIG. 6.

As another example, lighting in a physical environment may be considered in rendering a three-dimensional virtual model. For example, MR computing device 104 may obtain lighting data indicating ambient light characteristics of a physical environment, and may render a three-dimensional object at least in part by applying a lighting effect to the three-dimensional object based at least on the lighting data. FIG. 1 shows an example in which received lighting data indicates the presence of a directional light source 116 in environment 100. Accordingly, three-dimensional object 108 is rendered at least in part by applying a highlight 118 including a glare spot 120 to a surface of the object facing directional light source 116, as if the object were a real object in environment 100 and were lit by the directional light source. Alternative or additional lighting effects, such as global lighting effects, also may be applied. Further, other visual characteristics of the environment, such as surface textures and diffusivities, may be considered in rendering a three-dimensional virtual model.

Such lighting effects applied to a three-dimensional virtual model also may be rendered for display in an MR thumbnail image of the three-dimensional virtual model. For example, FIG. 2 shows highlight 118 and glare spot 120 applied to three-dimensional virtual model 108 in mixed reality thumbnail image 202.

Lighting data may be collected and stored in any suitable manner. For example, lighting data may be measured by one or more monochromatic image sensors included in MR computing device 104, and may be stored, for each sensor, as an intensity and a direction. In another example, lighting data may be collected by analyzing shadow regions in image data and deriving lighting data from the analyzed shadow regions. Lighting data used for rendering reflections may include image data and may be stored as cube maps, for example, or in any other suitable form.

As mentioned above, images of a physical environment, lighting effects, and other data acquired at the time a three-dimensional virtual model is saved may be saved along with the three-dimensional virtual model data file as a combined save file for the model. In this manner, when the three-dimensional virtual model is updated and again saved, the image data, lighting data, and other data in the save file may be applied to subsequent revisions of the three-dimensional virtual model, and used to generate updated thumbnail images. Examples of other data that may be saved in the save file include, but are not limited to, depth data (e.g. surface reconstruction data) for the physical environment and material property data (textures, diffusivities, etc.).

Figure 3:
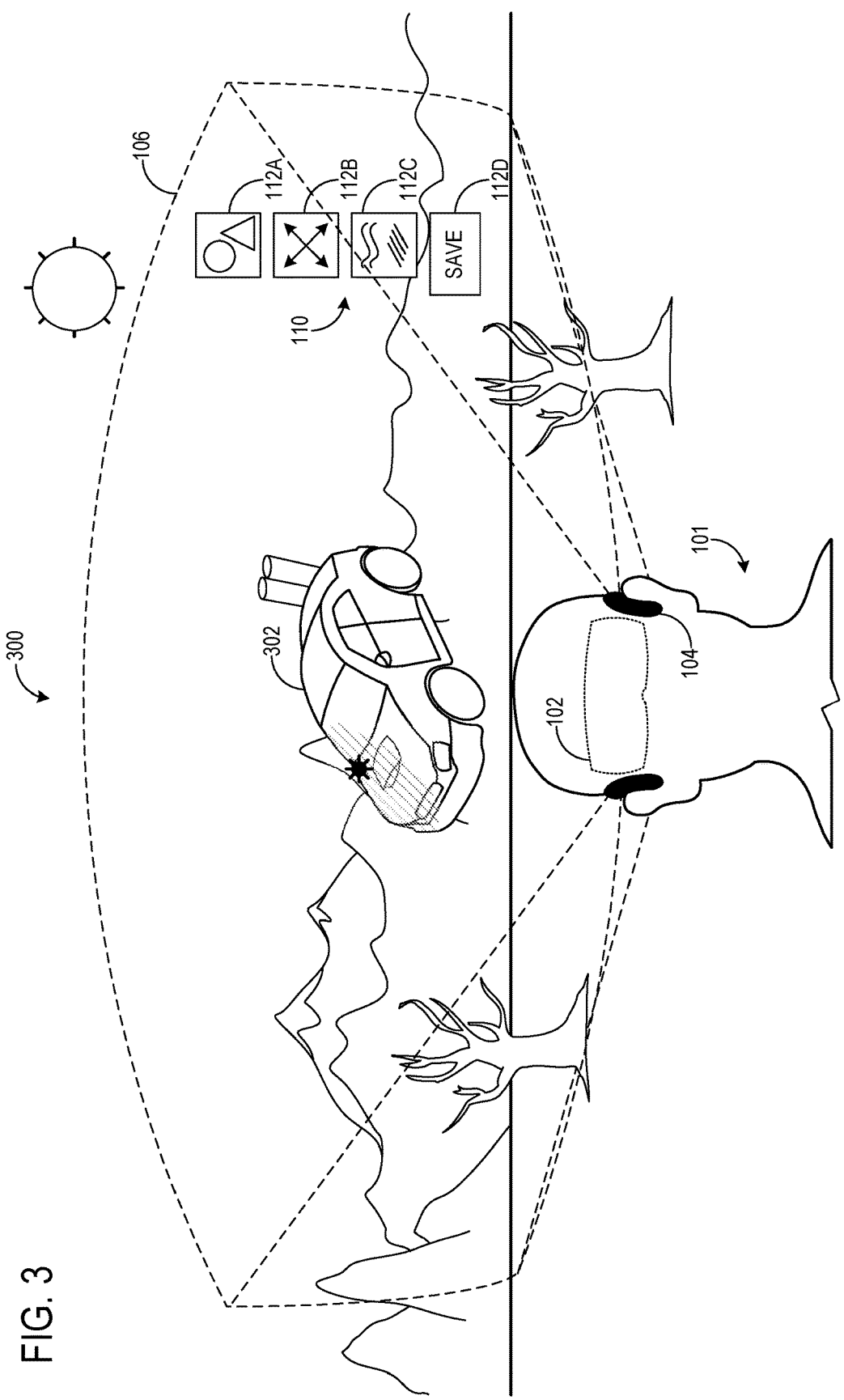
FIG. 3 shows another example mixed reality environment, and illustrates editing of the three-dimensional virtual model of FIG. 1.

FIG. 3 depicts an example scenario in which user 101 edits three-dimensional virtual model 108 in a use environment 300 different from use environment 100 (FIG. 1). In the example shown in FIG. 3, user 101 has updated three-dimensional virtual model 108 by adding a hood intake and exhaust pipes to thereby form an updated three-dimensional virtual model 302. MR computing device 104 then may render an image of updated three-dimensional virtual model 302 by applying the lighting effect to the updated-three dimensional model that was applied to the previous version 108. As such, FIG. 3 shows highlight 118 and glare spot 120 applied to updated three-dimensional virtual model 302, even though directional light source 116 is absent.

Figure 4:
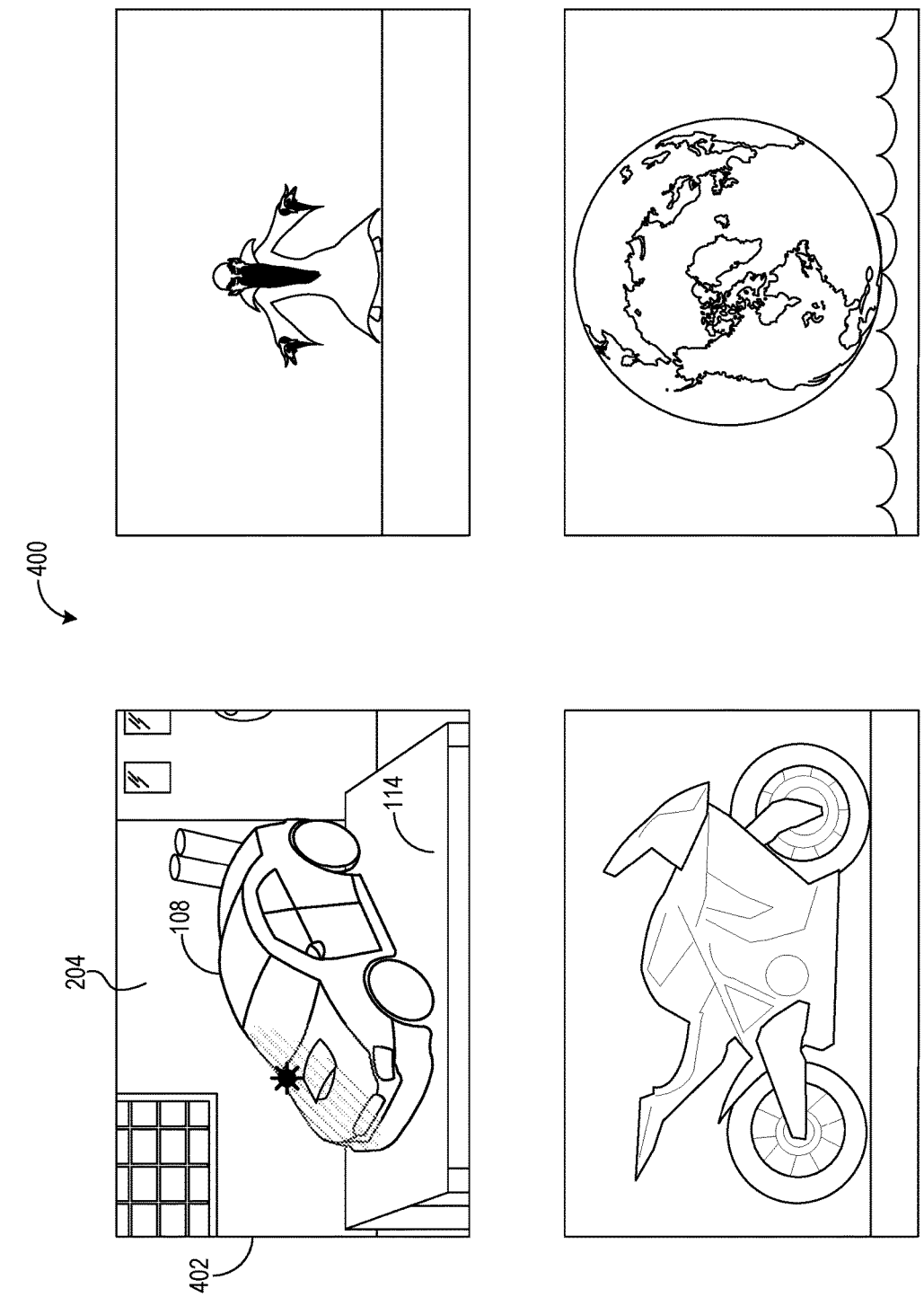
FIG. 4 shows an example user interface including an updated mixed reality thumbnail image.

FIG. 4 shows a user interface 400 including an updated mixed reality thumbnail image 402, along with other mixed reality thumbnail images. Updated mixed reality thumbnail image 402 is formed by compositing a view of a rendering of updated three-dimensional virtual model 302 and previously-saved image 204 of physical environment 100. The composition may be performed in response to engagement with save button 112D in user interface 110, for example, using the previously-acquired image 204 stored with the save file, and potentially other data stored with the save file.

By using a previously-acquired image of a physical environment and an updated rendering of a three-dimensional virtual model to update a mixed reality thumbnail image, continuity of the overall appearance of the thumbnail image is preserved between saves, yet updates to the three-dimensional model are also reflected. Utilizing the same background image for updated thumbnail images as for previous thumbnail images may help a user quickly identify a desired file by familiar appearance, yet also allow the user to view the current state of the model directly from the thumbnail.

The examples described herein also may be used to form an animated mixed reality thumbnail presentation comprising a plurality of mixed reality thumbnail images. For example, a plurality of images of a physical environment may be acquired and composited with a corresponding plurality of views of a three-dimensional virtual model to form a plurality of mixed reality thumbnail images. The plurality of mixed reality thumbnail images may be played back in a sequence to thereby present an animated mixed reality thumbnail presentation. In some examples, the location of a three-dimensional virtual model may be displayed at a fixed location in a physical environment, which may allow a user to generate an animated mixed reality thumbnail presentation showing the three-dimensional virtual model from a variety of locations and/or angles by varying the location of an image sensor used to acquire images of the physical environment.

As mentioned above, other data may be acquired in forming animated mixed reality thumbnail presentations. For example, audio data captured temporally proximate to the acquisition of a plurality of images may be used in forming an animated mixed reality thumbnail presentation.

The audio data then may be played back while displaying the animated mixed reality thumbnail presentation. The audio data may include user narration, for example. Further, as described above, lighting data may be used for each image included in an animated mixed reality thumbnail presentation. For example, for each image of a plurality of images used to form an animated mixed reality thumbnail presentation, lighting data indicating an ambient light condition of a physical environment may be received, and a view of a three-dimensional virtual model for each of the plurality of images may be rendered with a respective lighting effect.

Figure 5:
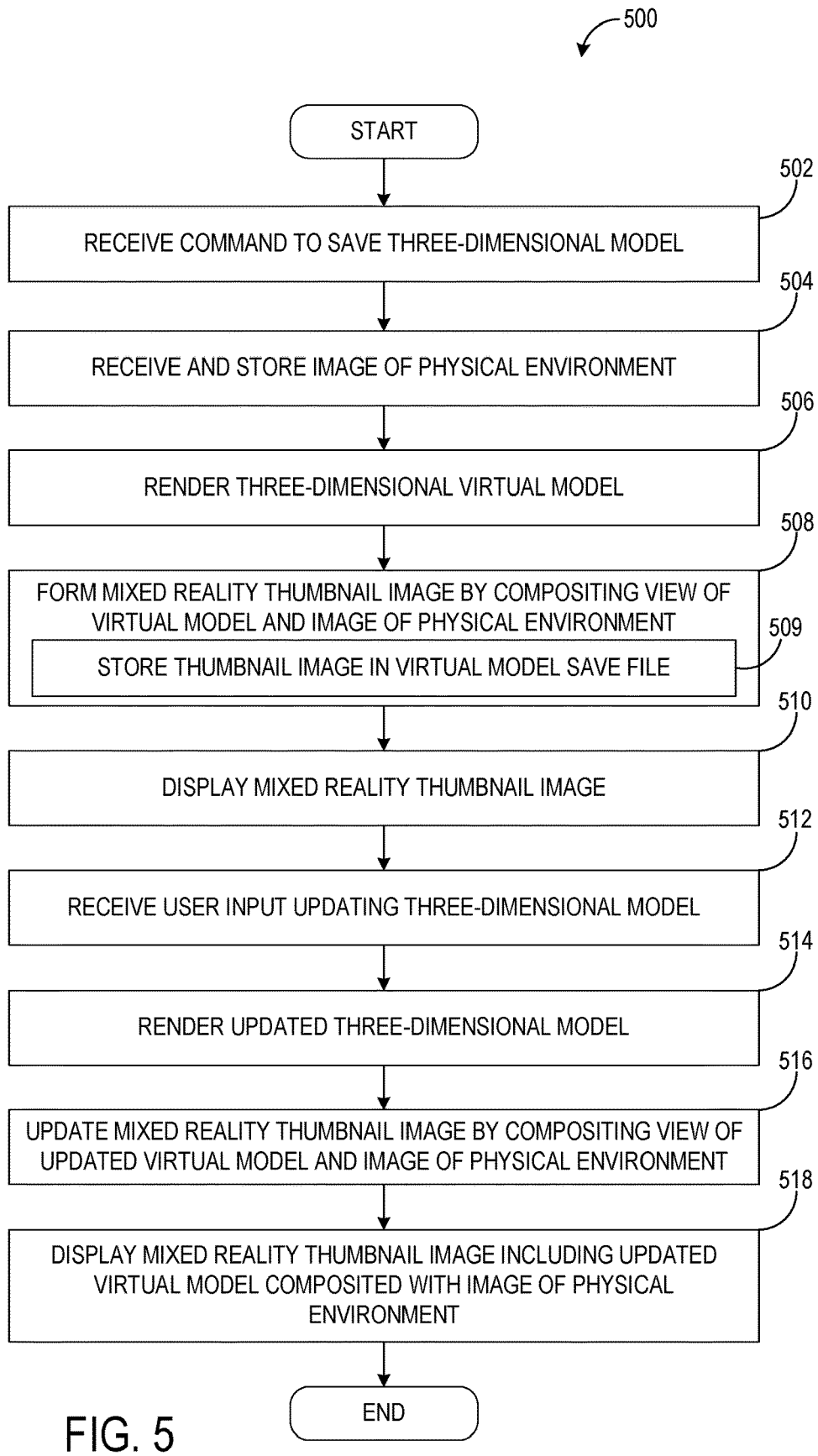
FIG. 5 shows a flowchart illustrating an example method for forming a mixed reality thumbnail image.

FIG. 5 shows a flow diagram illustrating an example method 500 of forming a mixed reality thumbnail image. Method 500 may be executed by MR computing device 104 (FIG. 1), for example. Method 500 includes, at 502, receiving a save command for a three-dimensional virtual model. The save command may be entered by a user, or may be automatically generated (e.g., wherein the computing device is configured to auto-save open files on a periodic basis). In response to the save command, method 500 includes, at 504, receiving and storing an image of a physical environment in which the three-dimensional model is being edited, and at 506, rendering a view of the three-dimensional virtual model. The image and the model may be saved together as components of a save file for the three-dimensional model, along with any other suitable data, such as audio data, depth data, texture data, surface material data, etc.

Method 500 further includes, at 508, forming a mixed reality thumbnail image by compositing the rendering of the three-dimensional virtual model and the image of the physical environment. The mixed reality thumbnail image also may be stored as a part of the save file for the three-dimensional virtual model, as indicated at 509. Method 500 further includes, at 510, displaying the mixed reality thumbnail image, for example, on a user interface that allows the virtual model file to be opened for viewing, editing, and/or other actions. In other examples, a mixed reality thumbnail image may be stored in response to other triggers than a save command.

Continuing, method 500 includes, at 512, receiving user input updating the three-dimensional virtual model. Upon receipt of a suitable triggering input, method 500 includes, at 514, rendering the updated three-dimensional virtual model, and at 516, updating the mixed reality thumbnail image by compositing a view of the updated three-dimensional virtual model with the image of the physical environment that is stored with the save file for the three-dimensional model. Method 500 further includes, at 518, displaying the updated mixed reality thumbnail image including the updated three-dimensional virtual model composited with the image of the physical environment, for example, on a user interface that allows the virtual model file to be opened for viewing, editing, and/or other actions. In this manner, the mixed reality thumbnail may reflect a most recent appearance of the three-dimensional virtual model, yet be set in a consistent background even when edited in different locations.

Figure 6:
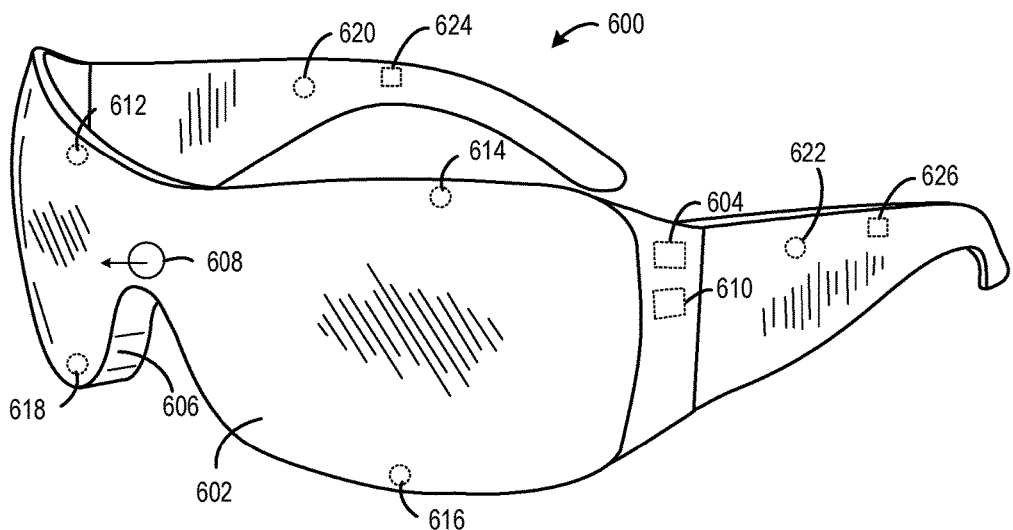
FIG. 6 shows an example head-mounted display device.

FIG. 6 shows a non-limiting example of an HMD device 600 in the form of a pair of wearable glasses with a transparent display 602. In other examples, an HMD device may take any other suitable form in which a transparent, semi-transparent, and/or non-transparent display is supported in front of a viewer's eye or eyes.

The HMD device 600 includes a controller 604 configured to control operation of the see-through display 602. The see-through display 602 may enable images such as holographic objects to be delivered to the eyes of a wearer of the HMD device 600. The see-through display 602 may be configured to visually augment an appearance of a real-world, physical environment to a wearer viewing the physical environment through the transparent display. For example, the appearance of the physical environment may be augmented by graphical content that is presented via the transparent display 602 to create a mixed reality environment. In one example, the display may be configured to display one or more visual digital content items. In some cases, the digital content items may be virtual objects overlaid in front of the real-world environment. Likewise, in some cases, the digital content items may incorporate elements of real-world objects of the real-world environment seen through the transparent display 602.

Any suitable mechanism may be used to display images via transparent display 602. For example, transparent display 602 may include image-producing elements located within lenses 606 (such as, for example, a see-through Organic Light-Emitting Diode (OLED) display). As another example, the transparent display 602 may include a light modulator located within a frame of HMD device 600. In this example, the lenses 606 may serve as a light guide for delivering light from the light modulator to the eyes of a wearer. Such a light guide may enable a wearer to perceive a 3D holographic image located within the physical environment that the wearer is viewing, while also allowing the wearer to view physical objects in the physical environment, thus creating a mixed reality environment.

The HMD device 600 may also include various sensors and related systems to provide information to the controller 604. Such sensors may include, but are not limited to, a microphone array, one or more outward facing image sensors 608, and an inertial measurement unit (IMU) 610.

As a non-limiting example, the microphone array may include six microphones located on different portions of the HMD device 600. In some implementations, microphones 612 and 614 may be positioned on a top portion of the lens 606, and may be generally forward facing. Microphones 612 and 614 may be aimed at forty five degree angles relative to a forward direction of the HMD device 600. Microphones 612 and 614 may be further aimed in a flat horizontal plane of the HMD device 600. Microphones 612 and 614 may be omnidirectional microphones configured to capture sound in the general area/direction in front of the HMD device 600, or may take any other suitable form.

Microphones 616 and 618 may be positioned on a bottom portion of the lens 606. As one non-limiting example, microphones 616 and 618 may be forward facing and aimed downward to capture sound emitted from the wearer's mouth. In some implementations, microphones 616 and 618 may be directional microphones. In some implementations, microphones 612, 614, 616, and 618 may be positioned in a frame surrounding the lens 606.

Microphones 620 and 622 each may be positioned on a side frame of the HMD device 600. Microphones 620 and 622 may be aimed at ninety degree angles relative to a forward direction of the HMD device 600. Microphones 620 and 622 may be further aimed in a flat horizontal plane of the HMD device 600. The microphones 620 and 622 may be omnidirectional microphones configured to capture sound in the general area/direction on each side of the HMD device 600. It will be understood that any other suitable microphone array other than that described above also may be used.

The depicted microphone array is merely one non-limiting example of a suitable microphone array, and any suitable number of microphones in any suitable configuration may be implemented without departing from the scope of the present disclosure. Audio data captured by one or more of the microphones described herein may be saved to a three-dimensional virtual model save file, for example.

The one or more outward facing image sensors 608 may be configured to capture visual data from the physical environment in which the HMD device 600 is located. For example, the outward facing sensors 608 may be configured to detect movements within a field of view of the display 602, such as movements performed by a wearer or by a person or physical object within the field of view. In one example, the outward facing sensors 608 may detect a user speaking to a wearer of the HMD device. The outward facing sensors may also capture 2D image information and depth information from the physical environment and physical objects within the environment. For example, the outward facing image sensors 608 may be configured to collect image data of a physical environment, lighting data regarding an ambient light condition of the physical environment, depth data of surfaces in the physical environment, material property data of surfaces in the physical environment, etc. Image data, lighting data, surface material property data, and/or depth data acquired by the outward facing image sensors 608, including derivatives thereof, may be included in a three-dimensional virtual model save file, for example.

The IMU 610 may be configured to provide position and/or orientation data of the HMD device 600 to the controller 604. In one embodiment, the IMU 610 may be configured as a three-axis or three-degree of freedom position sensor system. This example position sensor system may, for example, include three gyroscopes to indicate or measure a change in orientation of the HMD device 600 within 3D space about three orthogonal axes (e.g., x, y, z) (e.g., roll, pitch, yaw). The orientation derived from the sensor signals of the IMU may be used to determine a direction of a user that has engaged the wearer of the HMD device in a conversation.

In another example, the IMU 610 may be configured as a six-axis or six-degree of freedom position sensor system. Such a configuration may include three accelerometers and three gyroscopes to indicate or measure a change in location of the HMD device 600 along the three orthogonal axes and a change in device orientation about the three orthogonal axes. In some embodiments, position and orientation data from the image sensor 408 and the IMU 610 may be used in conjunction to determine a position and orientation of the HMD device 600.

The HMD device 600 may further include speakers 624 and 626 configured to output sound to the wearer of the HMD device. The speakers 624 and 626 may be positioned on each side frame portion of the HMD device proximate to the wearer's ears. For example, the speakers 624 and 626 may play audio content such as music, or a soundtrack to visual content displayed via the see-through display 602. In some cases, a volume of the speakers may be lowered or muted in response to a conversation between the wearer and another person being detected.

The controller 604 may include a logic device and a storage device that may be in communication with the various sensors and display of the HMD device 600. In one example, the storage device may include instructions that are executable by the logic device to receive, from an image sensor, an image of a physical environment, store the image of the physical environment, render a three-dimensional virtual model, form a mixed reality thumbnail image by compositing a view of the three-dimensional virtual model and the image of the physical environment, display, on a display device, the mixed reality thumbnail image, receive a user input updating the three-dimensional virtual model, render the updated three-dimensional virtual model, update the mixed reality thumbnail image by compositing a view of the updated three-dimensional virtual model and the image of the physical environment, and display, on the display device, the mixed reality thumbnail image including the updated three-dimensional virtual model composited with the image of the physical environment.

In some embodiments, the methods and processes described herein may be tied to a computing system of one or more computing devices. In particular, such methods and processes may be implemented as a computer-application program or service, an application-programming interface (API), a library, and/or other computer-program product.

Figure 7:
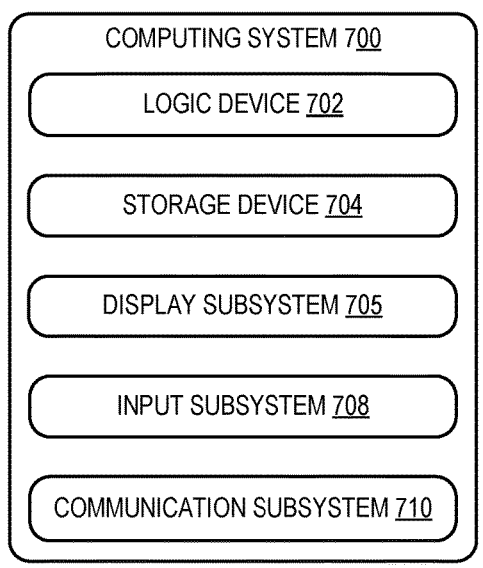
FIG. 7 shows a block diagram of an example computing device.

HMD device 600 is one example of a computing system on which the examples disclosed herein may be implemented. More generally, FIG. 7 schematically shows a block diagram of an example non-limiting embodiment of a computing system 700 that can enact one or more of the methods and processes described above. Computing system 700 is shown in simplified form. In addition to the HMD devices described herein, computing system 700 may take the form of one or more personal computers, server computers, tablet computers, home-entertainment computers, network computing devices, gaming devices, mobile computing devices, mobile communication devices (e.g., smart phone), and/or other computing devices.

Computing system 700 includes a logic device 702 and a storage device 704. Computing system 700 may optionally include a display subsystem 705, input subsystem 708, communication subsystem 710, and/or other components not shown in FIG. 7.

Logic device 702 includes one or more physical devices configured to execute instructions. For example, the logic device may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic device may include one or more processors configured to execute software instructions. Additionally or alternatively, the logic device may include one or more hardware or firmware logic devices configured to execute hardware or firmware instructions. Processors of the logic device may be single-core or multi-core, and the instructions executed thereon may be configured for sequential, parallel, and/or distributed processing. Individual components of the logic device optionally may be distributed among two or more separate devices, which may be remotely located and/or configured for coordinated processing. Aspects of the logic device may be virtualized and executed by remotely accessible, networked computing devices configured in a cloud-computing configuration.

Storage device 704 includes one or more physical devices configured to hold instructions executable by the logic device to implement the methods and processes described herein. When such methods and processes are implemented, the state of storage device 704 may be transformed—e.g., to hold different data.

Storage device 704 may include removable and/or built-in devices. Storage device 704 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage device 704 may include volatile, nonvolatile, dynamic, static, read/write, read-only, random-access, sequential-access, location-addressable, file-addressable, and/or content-addressable devices.

It will be appreciated that storage device 704 includes one or more physical devices. However, aspects of the instructions described herein alternatively may be propagated by a communication medium (e.g., an electromagnetic signal, an optical signal, etc.) that is not held by a physical device for a finite duration.

Aspects of logic device 702 and storage device 704 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The term "program" may be used to describe an aspect of computing system 700 implemented to perform a particular function. In some cases, a program may be instantiated via logic device 702 executing instructions held by storage device 704. It will be understood that different programs may be instantiated from the same application, service, code block, object, library, routine, API, function, etc. Likewise, the same program may be instantiated by different applications, services, code blocks, objects, routines, APIs, functions, etc. The term "program" may encompass individual or groups of executable files, data files, libraries, drivers, scripts, database records, etc.

It will be appreciated that a "service", as used herein, is an application program executable across multiple user sessions. A service may be available to one or more system components, programs, and/or other services. In some implementations, a service may run on one or more server-computing devices.

When included, display subsystem 705 may be used to present a visual representation of data held by storage device 704. This visual representation may take the form of a graphical user interface (GUI). As the herein described methods and processes change the data held by the storage device, and thus transform the state of the storage device, the state of display subsystem 705 may likewise be transformed to visually represent changes in the underlying data. Display subsystem 705 may include one or more display devices utilizing virtually any type of technology. Such display devices may be combined with logic device 702 and/or storage device 704 in a shared enclosure, or such display devices may be peripheral display devices.

When included, input subsystem 708 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 710 may be configured to communicatively couple computing system 700 with one or more other computing devices. Communication subsystem 710 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 700 to send and/or receive messages to and/or from other devices via a network such as the Internet.

Another example provides a mixed reality computing device comprising an image sensor, a display device, a storage device comprising instructions, and a processor. The processor may be configured to execute the instructions to receive, from the image sensor, an image of a physical environment, store the image of the physical environment, render a three-dimensional virtual model, form a mixed reality thumbnail image by compositing a view of the three-dimensional virtual model and the image of the physical environment, display, on the display device, the mixed reality thumbnail image, receive a user input updating the three-dimensional model, render the updated three-dimensional model, update the mixed reality thumbnail image by compositing a view of the updated three-dimensional model and the image of the physical environment, and display, on the display device, the mixed reality thumbnail image including the updated three-dimensional model composited with the image of the physical environment. In such an example, the instructions may alternatively or additionally be executable to receive lighting data indicating an ambient light condition of the physical environment, and to render the three-dimensional model at least in part by applying a lighting effect to the three-dimensional model, the lighting effect selected based at least on the lighting data. In such an example, the instructions may alternatively or additionally be executable to render the updated three-dimensional model at least in part by applying the lighting effect to the updated three-dimensional model. In such an example, the instructions may alternatively or additionally be executable to apply the lighting effect to the three-dimensional model by rendering a reflection on the three-dimensional of at least a portion of the physical environment based on the lighting data. In such an example, the instructions may alternatively or additionally be executable to form an animated mixed reality thumbnail presentation comprising a plurality of mixed reality thumbnail images by acquiring a plurality of images, and to composite the plurality of images with a corresponding plurality of views of the three-dimensional model. In such an example, the instructions may alternatively or additionally be executable to receive audio data captured temporally proximate to the acquisition of the plurality of images, and while displaying the animated mixed reality thumbnail presentation, play back the audio data. In such an example, the instructions may alternatively or additionally be executable to, for each image of the plurality of images, receive lighting data indicating an ambient light condition of the physical environment, and to render the three-dimensional model for each of the plurality of images with a respective lighting effect, each lighting effect selected based on the lighting data corresponding to that image. In such an example, the physical environment may be a first physical environment, and the instructions may alternatively or additionally be executable to receive depth data corresponding to the first physical environment, and display over a second physical environment the three-dimensional model together with a virtual view of the first physical environment based at least on a surface reconstruction of the first physical environment from the depth data. In such an example, the instructions may alternatively or additionally be executable to apply a lighting effect to at least a portion of the second physical environment, the lighting effect selected based on the virtual view of the first physical environment. In such an example, the instructions may alternatively or additionally be executable to apply a lighting effect to the image of the physical environment, the lighting effect selected based on the three-dimensional model. Any or all of the above-described examples may be combined in any suitable manner in various implementations.

Another example provides, on a computing device, a method comprising receiving, from an image sensor, an image of a physical environment, storing the image of the physical environment, rendering a three-dimensional virtual model, forming a mixed reality thumbnail image by compositing a view of the three-dimensional virtual model and the image of the physical environment, displaying, on a display device, the mixed reality thumbnail image, receiving a user input updating the three-dimensional model, rendering the updated three-dimensional model, updating the mixed reality thumbnail image by compositing a view of the updated three-dimensional model and the image of the physical environment, and displaying, on the display device, the mixed reality thumbnail image including the updated three-dimensional model composited with the image of the physical environment. In such an example, the method may alternatively or additionally comprise receiving lighting data indicating an ambient light condition of the physical environment, and rendering the three-dimensional model at least in part by applying a lighting effect to the three-dimensional model, the lighting effect selected based at least on the lighting data. In such an example, the method may alternatively or additionally comprise rendering the updated three-dimensional model at least in part by applying the lighting effect to the updated three-dimensional model. In such an example, the method may alternatively or additionally comprise applying the lighting effect to the three-dimensional model by rendering a reflection on the three-dimensional of at least a portion of the physical environment based on the lighting data. In such an example, the method may alternatively or additionally comprise forming an animated mixed reality thumbnail presentation comprising a plurality of mixed reality thumbnail images by acquiring a plurality of images, and compositing the plurality of images with a corresponding plurality of views of the three-dimensional model. In such an example, the method may alternatively or additionally comprise, for each image of the plurality of images, receiving lighting data indicating an ambient light condition of the physical environment, and rendering the three-dimensional model for each of the plurality of images with a respective lighting effect, each lighting effect selected based on the lighting data corresponding to that image. In such an example, the physical environment may be a physical environment, and the method may alternatively or additionally comprise receiving depth data corresponding to the first physical environment, and displaying over a second physical environment the three-dimensional model together with a virtual view of the first physical environment based at least on a surface reconstruction of the first physical environment from the depth data. In such an example, the method may alternatively or additionally comprise applying a lighting effect to the image of the physical environment, the lighting effect selected based on the three-dimensional model. Any or all of the above-described examples may be combined in any suitable manner in various implementations.

Another example provides a head-mounted display device comprising a see-through display device, an image sensor, storage comprising stored instructions, and a processor configured to execute the instructions to receive, from the image sensor, an image of a physical environment, store the image of the physical environment, receive lighting data indicating an ambient lighting condition of the physical environment, render a three-dimensional virtual model with a lighting effect applied to the three-dimensional model, the lighting effect selected based at least on the lighting data, form a mixed reality thumbnail image by compositing a view of the three-dimensional virtual model and the image of the physical environment, display, on the see-through display device, the mixed reality thumbnail image, receive a user input updating the three-dimensional model, render the updated three-dimensional model with the lighting effect applied to the updated three-dimensional model, update the mixed reality thumbnail image by compositing a view of the updated three-dimensional model and the image of the physical environment, and display, on the see-through display device, the mixed reality thumbnail image including the updated three-dimensional model composited with the image of the physical environment. In such an example, the lighting effect may be a first lighting effect, and the instructions may alternatively or additionally be executable to apply a second lighting effect to the image of the physical environment, the second lighting effect selected based on the three-dimensional model. Any or all of the above-described examples may be combined in any suitable manner in various implementations.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A mixed reality computing device, comprising
  an image sensor;
  a display device;
  a storage device comprising instructions; and
  a processor configured to execute the instructions to
    receive, from the image sensor, a first physical environment image during a first use session;
    store the first physical environment image;
    render a three-dimensional virtual model;
    form a mixed reality thumbnail image by compositing a view of the three-dimensional virtual model and the first physical environment image;
    display, on the display device, the mixed reality thumbnail image;
    save the three-dimensional virtual model and the mixed reality thumbnail image in a save file;
    receive a user input selecting the mixed reality thumbnail image, and in response open the three-dimensional virtual model for editing during a second use session;

receive a user input updating the three-dimensional virtual model during the second use session to form an updated three-dimensional virtual model;

render the updated three-dimensional virtual model;

receive, from the image sensor, a second physical environment image during the second use session;

update the mixed reality thumbnail image by compositing a view of the updated three-dimensional virtual model and the first physical environment image from the first use session to thereby provide continuity of an overall appearance of the mixed reality thumbnail image between the first use session and the second use session;

save the updated three-dimensional virtual model and the mixed reality thumbnail image in the save file; and display, on the display device, the mixed reality thumbnail image including the updated three-dimensional virtual model composited with the first physical environment image.

2. The mixed reality computing device of claim 1, wherein the instructions are further executable to receive lighting data indicating an ambient light condition of a physical environment, and to render the three-dimensional virtual model at least in part by applying alighting effect to the three-dimensional virtual model, the lighting effect selected based at least on the lighting data.

3. The mixed reality computing device of claim 2, wherein the instructions are further executable to render the updated three-dimensional virtual model at least in part by applying the lighting effect to the updated three-dimensional virtual model.

4. The mixed reality computing device of claim 2, wherein the instructions are further executable to apply the lighting effect to the three-dimensional virtual model by rendering a reflection on the three-dimensional virtual model of at least a portion of the physical environment based on the lighting data.

5. The mixed reality computing device of claim 1, wherein the instructions are further executable to form an animated mixed reality thumbnail presentation comprising a plurality of mixed reality thumbnail images by acquiring a plurality of images, and to composite the plurality of images with a corresponding plurality of views of the three-dimensional virtual model.

6. The mixed reality computing device of claim 5, wherein the instructions are further executable to receive audio data captured temporally proximate to the acquisition of the plurality of images; and while displaying the animated mixed reality thumbnail presentation, play back the audio data.

7. The mixed reality computing device of claim 5, wherein the instructions are further executable to, for each image of the plurality of images, receive lighting data indicating an ambient light condition of a physical environment, and to render the three-dimensional virtual model for each of the plurality of images with a respective lighting effect, each lighting effect selected based on the lighting data corresponding to that image.

8. The mixed reality computing device of claim 1, wherein the instructions are further executable to receive depth data corresponding to a first physical environment; and display over a second physical environment the three-dimensional virtual model together with a virtual view of the first physical environment based at least on a surface reconstruction of the first physical environment from the depth data.

9. The mixed reality computing device of claim 8, wherein the instructions are further executable to apply a lighting effect to at least a portion of the second physical environment, the lighting effect selected based on the virtual view of the first physical environment.

10. The mixed reality computing device of claim 1, wherein the instructions are further executable to apply a lighting effect to the first physical environment image, the lighting effect selected based on the three-dimensional virtual model.

11. On a computing device, a method comprising receiving, from an image sensor, a first physical environment image;

storing the first physical environment image;

rendering a three-dimensional virtual model during a first use session;

forming a mixed reality thumbnail image by compositing a view of the three-dimensional virtual model and the first physical environment image;

displaying, on a display device, the mixed reality thumbnail image;

saving the three-dimensional virtual model and the mixed reality thumbnail image in a save file;

receiving a user input selecting the mixed reality thumbnail image, and in response opening the three-dimensional virtual model for editing during a second use session;

receiving a user input updating the three-dimensional virtual model during the second use session to form an updated three-dimensional virtual model;

rendering the updated three-dimensional virtual model;

receiving, from the image sensor, a second physical environment image during the second use session;

updating the mixed reality thumbnail image by compositing a view of the updated three-dimensional virtual model and the first physical environment image from the first use session to thereby provide continuity of an overall appearance of the mixed reality thumbnail image between the first use session and the second use session;

saving the updated three-dimensional virtual model and the mixed reality thumbnail image in the save file; and displaying, on the display device, the mixed reality thumbnail image including the updated three-dimensional virtual model composited with the first physical environment image.

12. The method of claim 11, further comprising receiving lighting data indicating an ambient light condition of a physical environment and rendering the three-dimensional virtual model at least in part by applying a lighting effect to the three-dimensional virtual model, the lighting effect selected based at least on the lighting data.

13. The method of claim 12, further comprising rendering the updated three-dimensional virtual model at least in part by applying the lighting effect to the updated three-dimensional virtual model.

14. The method of claim 12 further comprising applying the lighting effect to the three-dimensional virtual model by rendering a reflection on the three-dimensional virtual model of at least a portion of the physical environment based on the lighting data.

15. The method of claim 11, further comprising forming an animated mixed reality thumbnail presentation comprising a plurality of mixed reality thumbnail images by acquiring a plurality of images, and compositing the plurality of images with a corresponding plurality of views of the three-dimensional virtual model.

16. The method of claim 15, further comprising, for each image of the plurality of images, receiving lighting data indicating an ambient light condition of a physical environment, and rendering the three-dimensional virtual model for each of the plurality of images with a respective lighting effect, each lighting effect selected based on the lighting data corresponding to that image.

17. The method of claim 11, further comprising
receiving depth data corresponding to a first physical environment; and
displaying over a second physical environment the three-dimensional virtual model together with a virtual view of the first physical environment based at least on a surface reconstruction of the first physical environment from the depth data.

18. The method of claim 11, further comprising applying a lighting effect to the first physical environment image, the lighting effect selected based on the three-dimensional virtual model.

19. A head-mounted display device, comprising a see-through display device;
an image sensor;
storage comprising stored instructions; and
a processor configured to execute the instructions to
receive, from the image sensor, a first physical environment image during a first use session;
store the first physical environment image;
receive lighting data indicating an ambient lighting condition of a physical environment;
render a three-dimensional virtual model with a lighting effect applied to the three-dimensional virtual model, the lighting effect selected based at least on the lighting data;
form a mixed reality thumbnail image by compositing a view of the three-dimensional virtual model and the first physical environment image;
display, on the see-through display device, the mixed reality thumbnail image;
save the three-dimensional virtual model and the mixed reality thumbnail image in a save file;
receive a user input selecting the mixed reality thumbnail image, and in response open the three-dimensional virtual model for editing during a second use session;
receive a user input updating the three-dimensional virtual model during the second use session to form an updated three-dimensional virtual model;
render the updated three-dimensional virtual model with the lighting effect applied to the updated three-dimensional virtual model;
receive, from the image sensor, a second physical environment image during the second use session;
update the mixed reality thumbnail image by compositing a view of the updated three-dimensional virtual model and the first physical environment image from the first use session to thereby provide continuity of an overall appearance of the mixed reality thumbnail image between the first use session and the second use session;
save the updated three-dimensional virtual model and the mixed reality thumbnail image in the save file; and
display, on the see-through display device, the mixed reality thumbnail image including the updated three-dimensional virtual model composited with the first physical environment image.

20. The head-mounted display device of claim 19, wherein the lighting effect is a first lighting effect, and wherein the instructions are further executable to apply a second lighting effect to the first physical environment image, the second lighting effect selected based on the three-dimensional virtual model.

* * * * *